US007020353B1

(12) United States Patent
McCaffrey et al.

(10) Patent No.: US 7,020,353 B1
(45) Date of Patent: Mar. 28, 2006

(54) EXTENDED DYNAMIC RANGE IMAGING SYSTEM AND METHOD

(75) Inventors: Neil J. McCaffrey, Hampton Falls, NH (US); Peter A. Levine, West Windsor, NJ (US); Frank P. Pantuso, Sr., Fort Belvoir, VA (US); Donald J. Sauer, Shell Beach, CA (US)

(73) Assignee: Sarnoff Corporation, Princeton, NJ (US)

( * ) Notice: Subject to any disclaimer, the term of this patent is extended or adjusted under 35 U.S.C. 154(b) by 1328 days.

(21) Appl. No.: 09/631,229

(22) Filed: Aug. 2, 2000

Related U.S. Application Data

(63) Continuation of application No. 08/867,652, filed on Jun. 2, 1997, now Pat. No. 6,101,294.

(51) Int. Cl.
*G06K 7/00* (2006.01)

(52) U.S. Cl. .................... 382/312; 250/208.1; 250/330

(58) Field of Classification Search ................ 382/270, 382/312; 341/155; 250/208.1, 330; 348/294, 348/296, 297, 307, 217.1
See application file for complete search history.

(56) References Cited

U.S. PATENT DOCUMENTS 3,953,733 A * 4/1976 Levine ........................ 250/330
4,392,157 A * 7/1983 Garcia et al. ............... 348/243
4,523,326 A * 6/1985 Hewitt et al. ................. 377/58

FOREIGN PATENT DOCUMENTS

JP 404225687 A * 8/1992
JP 404354160 A * 12/1992

OTHER PUBLICATIONS

Hopkinson, "Radiation Effects on CCDs for Spaceborne Acquistion and Tracking Applications", IEEE First European Conference on Radiation and Its Effects on Devices and Systems, Sep. 1991, pps. 368-372.*

* cited by examiner

*Primary Examiner*—Anh Hong Do
(74) *Attorney, Agent, or Firm*—William J. Burke, Esq.

(57) ABSTRACT

In one embodiment, an imager has an array of photodetectors, each of which accumulates charge during an integration period as a result of light detected during the integration period, the array having a charge capacity which increases during the integration period. A charge capacity controller coupled to the imager adjusts how the imager increases the charge capacity of the array based upon the brightness distribution detected by the imager during at least one previous integration period.

20 Claims, 2 Drawing Sheets

EXTENDED DYNAMIC RANGE IMAGING SYSTEM AND METHOD

This application is a continuation application under 37 C.F.R. 1.60, of prior application Ser. No. 08/867,652 filed on Jun. 2, 1997 now U.S. Pat. No. 6,101,294.

BACKGROUND OF THE INVENTION

1. Field of the Invention

The present invention relates to imaging systems and, in particular, to imaging systems which increase photodetector charge capacity towards the end of the integration period to extend the dynamic range of the imaging system.

2. Description of the Related Art

Various types of imagers or image sensors are in use today, including charge-coupled device (CCD) image sensors and complementary metal-oxide semiconductor CMOS image sensors. These devices are typically incorporated into CCD and CMOS imaging systems, respectively. Such systems comprise an array of pixels, each of which contains a light-sensitive sensor element such as a CCD or, in CMOS image sensors, a virtual gate buried n-channel photodetector, a N+ to p-substrate photodiode, or a photogate detector. Such light-sensitive sensor elements will be referred to herein, generally, as photodetectors.

In such devices, the photodetector accumulates charge and hence voltage during the optical integration period in accordance with the light intensity reaching the relevant sensing area of the photodetector. As charge accumulates, the photodetector begins to fill. The charge stored in a photodetector is sometimes said to be stored in the "charge well" of CCD-type photodetectors. If the photodetector becomes full of charge, then excess charge is shunted off, in part to prevent blooming. Blooming is a phenomenon in which excess charge beyond pixel saturation spills over into adjacent pixels, causing blurring and related image artifacts. However, if the photodetector becomes full before the end of the integration period and any additional photons strike the photodetector, then no additional charge can be accumulated. Thus, for example, if very bright light is applied to a photodetector, this can cause the photodetector to be full before the end of the integration period and thus to saturate and lose information.

U.S. Pat. No. 3,953,733, issued Apr. 27, 1976 to Levine ("Levine"), the entirety of which is incorporated herein by reference, teaches a method of operating CCD imagers to avoid this problem. The voltage applied to the electrodes of a CCD cause a heavily depleted region to form beneath the electrode, which forms "potential wells" or charge wells of a given maximum charge capacity. A greater electrode voltage causes a correspondingly greater charge capacity well to form. The voltage that controls the maximum charge capacity of a photodetector, such as the CCD electrode voltage, will be referred to herein as the charge capacity control voltage, and the maximum charge that can be accumulated in a photodetector will be referred to herein as the photodetector's charge capacity. The charge capacity control voltage is also sometimes referred to as the blooming barrier voltage, since it acts as a blooming drain to remove charge from the pixel photodiode to avoid charge spilling into adjacent pixels during optical overload.

Typically, the charge capacity control voltage applied is constant throughout the integration period, so that a given charge capacity exists throughout the integration period for each pixel of the imager array. In Levine, the charge capacity control voltage is varied during the integration period, so as to increase the optical dynamic range of the CCD imager. For example, in one embodiment, Levine teaches increasing the charge capacity control voltage (and hence the charge capacity) in non-linear fashion, by increasing the charge capacity control voltage in discrete steps towards the end of the integration period. Levine also teaches other methods of increasing the charge capacity control voltage and charge capacity towards the end of the integration period to extend the dynamic range of the imaging system, such as using enough multiple discrete steps to implement a continuously increasing charge capacity control voltage; or using linearly increasing charge capacity control voltage waveforms and increasing the slope or slopes of such waveforms.

However, although this method may be used to extend the dynamic range of a given imager, it is possible that the extended dynamic range may not be utilized for given frames. For example, a given scene may be relatively dark, thus wasting dynamic range at the expense of loss of contrast ratio and scene information content. This may be the case with, for example, imaging systems used for surveillance purposes.

SUMMARY

A imaging system and method. In one embodiment, an imager has an array of photodetectors, each of which accumulates charge during an integration period as a result of light detected during said integration period, said array having a charge capacity which increases during the integration period. A charge capacity controller coupled to said imager adjusts how the imager increases the charge capacity of the array based upon the brightness distribution detected by said imager during at least one previous integration period.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

Figure 1A:
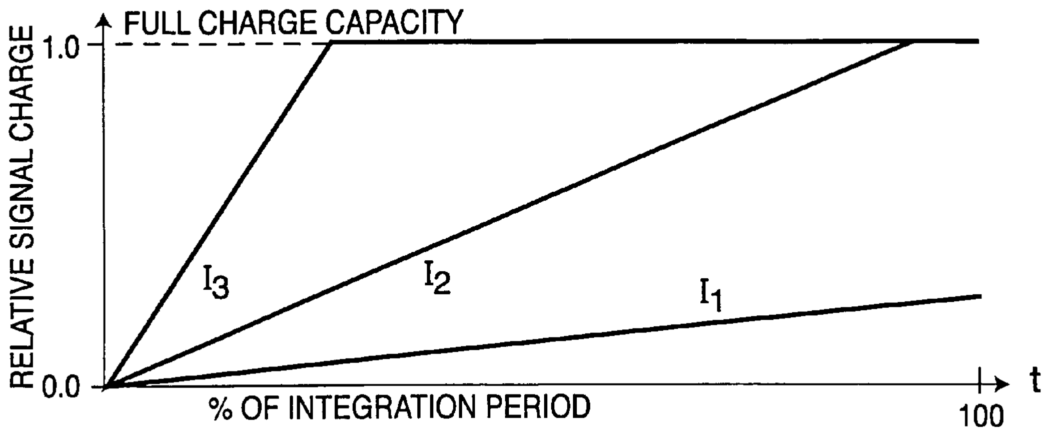
FIGS. 1A–C are diagrams of waveforms illustrating a method for extending the dynamic range of an imager, in accordance with an embodiment of the present invention.
Figure 1B:
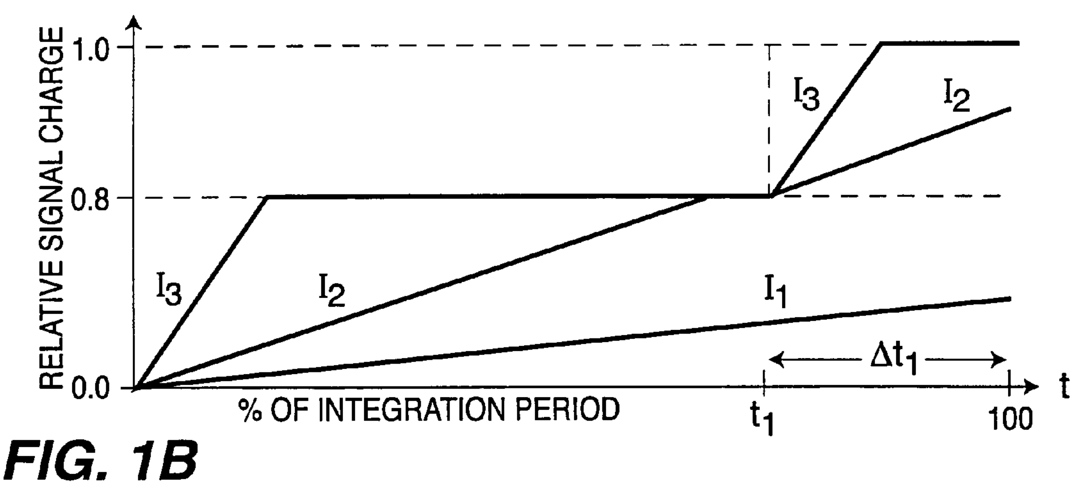
Figure 1C:
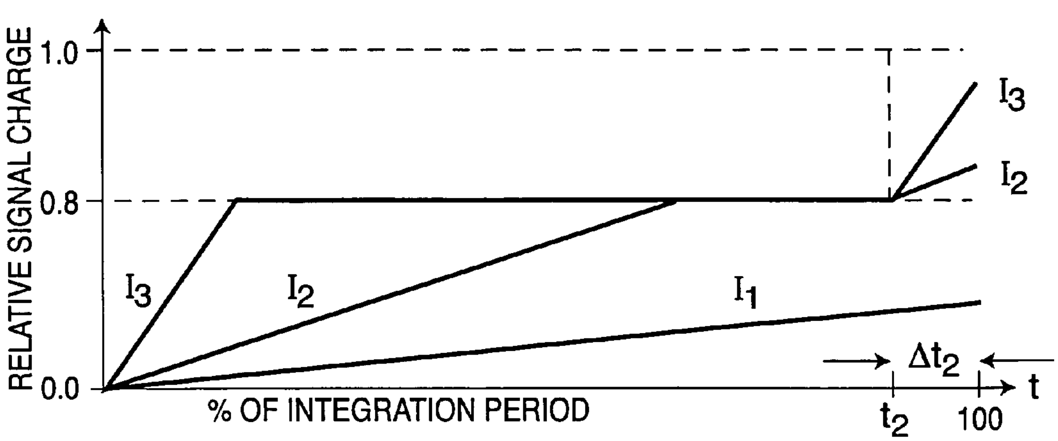

Referring now to FIGS. 1A–C, there are shown diagrams of waveforms illustrating a method for extending the dynamic range of an imager, in accordance with an embodiment of the present invention. Each of FIGS. 1A–C graphs the relative signal charge versus time, for three light levels I1, I2, and I3, where I3 is the most intense light level and I2 is the least intense light level. The relative signal charge is the charge accumulating in the photodiode's charge accumulation region or well in response to light of a given constant intensity. The time t is shown from t=0 to t=100% of the integration period, which is typically 1/30 or 1/60 of a second. The relative signal charge is shown from the range 0.0 to 1.0, where 1.0 indicates the maximum charge capacity of the photodetector, at which point the photodetector saturates.

FIG. 1A illustrates the relative signal charge versus time during the integration period for light levels I1, I2, and I3, where a fixed charge capacity control voltage is applied for the entire integration period, as prior art photodetectors are operated. As illustrated, the higher light levels I2 and I3 both saturate before the integration period is complete, since each causes the charge capacity of the photodetector to be exceeded. Therefore, light levels I2 and I3 both result in the same signal readout from the photodetector, even though they are different. Thus, since light levels I2 and I3 both saturate before the end of the integration period, it is not possible for the produced image to display any image details above these light levels. An array of photodetectors configured to operate at a certain constant charge capacity control voltage during the entire integration period does not have enough dynamic range to allow light levels I1, I2, and I3 to all be measured.

This can be the case for situations such as surveillance purposes, in which the intrascene dynamic range can exceed the dynamic range of the imager, causing saturation or blooming and thus lost information. If the imager lens is "stopped down" by adjusting the mechanical iris, this can effectively lower the slopes of all three light levels I1, I2, and I3, so that none of them saturate, but then the signal to noise ratio in the dark regions of the image is degraded, which again causes loss of information.

It is, therefore, useful to extend the dynamic range of an imaging system, by using a charge capacity control voltage function which increases the charge capacity control voltage in some manner during the integration period, as described above with respect to Levine. In one embodiment, the charge capacity control voltage function is a two-step non-linear voltage function in which a first charge capacity control voltage V1 is applied to the photodetector during a first portion of the integration period, and a higher charge capacity control voltage V2 is applied to the photodetector after this first portion, until the end of the integration period. In this embodiment, voltage V2 is the maximum charge capacity control voltage, i.e. voltage V2 causes the photodetector to have a maximum charge capacity, and voltage V1 is a fraction of voltage V2, thereby causing the photodetector to have a charge capacity that is a corresponding fraction of the maximum charge capacity.

Thus, charge capacity control voltage V1 is applied from during the first time period, which is a specified fraction of the integration period, and charge capacity control voltage V2 is applied for a second time period equal to the rest of the integration period after the first time period. By increasing the length of the first time period during which voltage V1 is applied, and correspondingly decreasing the second time period during which V2 is applied, a higher overall dynamic range can be obtained.

In the present invention, the charge capacity control voltage function is varied to provide sufficient dynamic range to avoid saturation while maximizing the contrast ratio and information content of the scene. For a two-step non-linear voltage function as described above, the charge capacity control voltage function is varied by varying how the integration period is divided between the first and second time periods. More dynamic range can be obtained by lengthening the first time period and shortening the second time period, at the expense of some loss of contrast information for higher-intensity light levels. The intense light levels that would have saturated if the maximum charge capacity control voltage had been applied during the entire integration period, but that do not saturate because they can add additional charge during the second time period, may be referred to as "compressed," since they will add extra charge to the photodetector for a shorter period of time than lower intensity light levels.

Thus, charge capacity control voltage V1 is applied from time t=0 to time t1, and charge capacity control voltage V2 is applied during time Δt1, where Δt1 is the time period between time t1 and the end of the integration period. By increasing the time period t1 during which V1 is applied, and correspondingly decreasing time period Δt1, during which V2 is applied, a higher overall dynamic range can be obtained. Thus, in one embodiment, for a given first charge capacity control voltage V1 and second charge capacity control voltage V2, the charge capacity control voltage function is varied by varying when time t1 occurs.

Such a charge capacity control voltage function is illustrated in FIGS. 1B and 1C, each having a different time at which voltage V1 changes to V2. Referring now to FIG. 1B, the charge capacity control voltage V1 is set to 80% of the maximum charge capacity control voltage V2. Voltage V1 is increased to voltage V2 at a time t1. Thus, until time t1, there is temporarily a saturation point due to a charge capacity that is only 80% of the maximum charge capacity that will exist when larger voltage V2 is applied after time t1. This allows for the contrast differentiation between light levels I2 and I3 that is not possible using the implementation illustrated in FIG. 1A, in which a constant charge capacity control voltage is used throughout the entire integration period. This is because, although light level I3 still saturates, light level I2 does not, so that light level I3 would produce a greater charge in a photodetector than would light level I2, which can thus be used to differentiate such light levels in an image.

However, because light level I3 does saturate, first period time t1 does not allow light levels of intensities around light level I3 to be differentiated from one another. In FIG. 1C, voltage V1 switches to voltage V2 at a time t2, which is later than time t1. In this implementation, neither light levels I2 nor I3 saturate, thus allowing all light levels up to I3 to be distinguished from one another.

In the present invention, before each frame of video data is captured with the array of photodetectors, the charge capacity control voltage function is optimally adjusted so as to provide sufficient dynamic range to avoid saturation for even the brightest portions of the scene or image captured, while maximizing the contrast ratio and information content of the scene. This is done by using dynamic feedback control from previous images to set the first time period so that the brightest objects in the scene just reach the saturation capacity of the imager, as explained in further detail below. Information from previous frames or images is used, based on the assumption that the brightness distribution of previous frames is a reliable predictor of the brightness distribution of the next frame to be captured.

As will be appreciated, varying the charge capacity control voltage effectively changes the pixel charge capacity, and extends the dynamic range of the pixel by only permitting a fraction of the maximum charge capacity to integrate for most of the frame time and increasing the charge capacity to maximum charge capacity towards the end of the integration time. This allows simultaneous imaging of the detail in both bright and dark regions of a scene. The dynamic adjustment of the charge capacity control voltage effectively creates a non-linear photodetection response during integration time.

Figure 2:
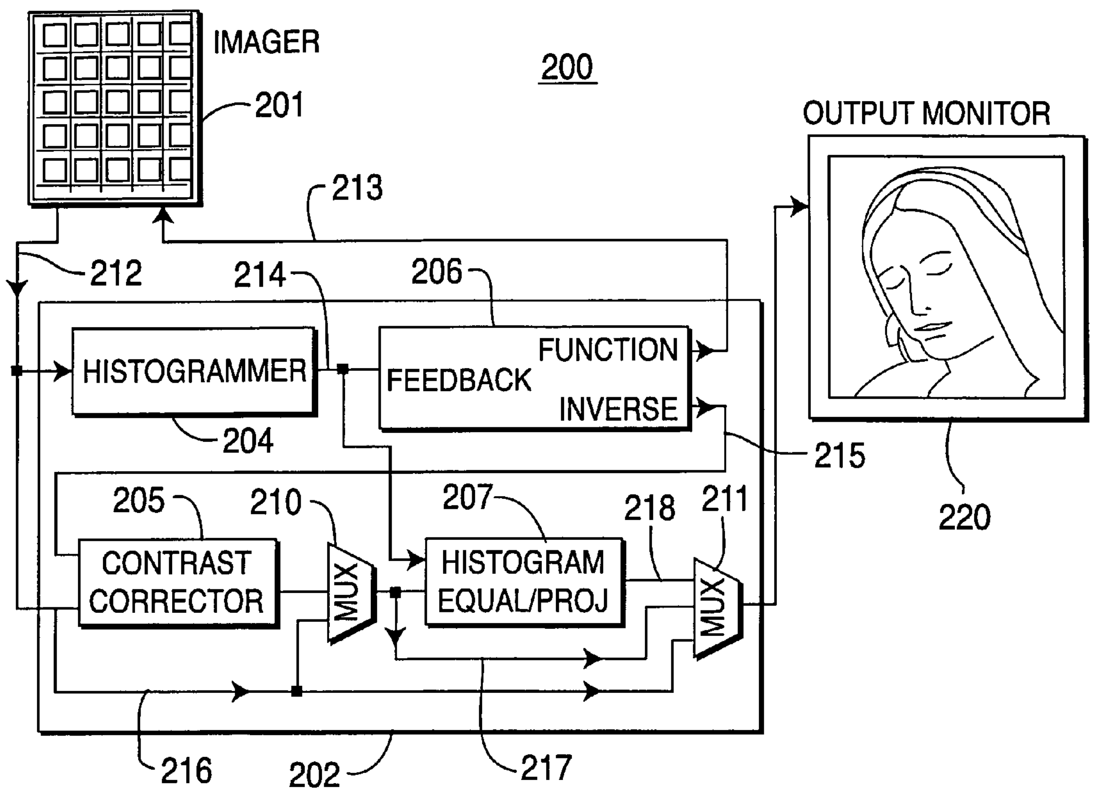
FIG. 2 is a block diagram of a video processing system for dynamically determining the charge capacity control voltage function used to extend the dynamic range of the system, in accordance with an embodiment of the present invention.

Referring now to FIG. 2, there is shown a block diagram of a video processing system 200 for dynamically determining the charge capacity control voltage function used to extend the dynamic range of the system, in accordance with an embodiment of the present invention. System 200 comprises imager 201, which comprises an array of pixels, each containing a photodetector. System 200 further comprises charge capacity controller 202 coupled to imager 201. Charge capacity controller 202 comprises histogrammer 204, feedback function generator 206, contrast corrector 205, histogram equalization/projection block 207, and MUXs 210 and 211. System 200 also comprises output monitor 220, which is coupled to the output of MUX 211 of charge capacity controller 202. The pixel array of imager 201 may be, for example, a CCD or CMOS array and provides, in one embodiment, 12-bit output pixel values (4096 levels) for each pixel, corresponding to the amount of charge accumulated by each pixel during the integration period. Output monitor 220 requires 8-bit input pixel information. Histogrammer 204 and contrast corrector 205 are coupled or couplable to imager 201 via line 212, and feedback function generator 206 is coupled or couplable to imager 201 via line 213.

The output pixel information for a frame of captured pixels is fed by imager 201, via bus 212, to histogrammer 204 and contrast corrector 205. Tap line 216 further provides the output pixel information as in input to MUXs 210 and 211. The output of histogrammer 204 is applied, via line 214, to the input of feedback function generator 206 and the input of histogram equalization/projection block 207. Feedback block provides function information via line 213 to an input of imager 201, and inverse function information to an input of contrast corrector 205. The output of contrast corrector 205 is applied, via MUX 210 and line 217, to histogram equalization/projection block 207 and to MUX 211. The output of histogram equalization/projection block 207 is applied, via line 218 and MUX 211, to the input of monitor 220.

As will be appreciated by those skilled in the art, some or all of the functions of charge capacity controller 202 (i.e., histogrammer 204, feedback function generator 206, contrast corrector 205, histogram equalization/projection block 207, and MUXs 210 and 211), may be implemented in real-time by dedicated digital signal processing hardware, by an application-specific integrated circuit (ASIC), or by a suitably-programmed general purpose computer processor.

System 200 operates as follows to dynamically adjust the charge capacity control voltage function to optimize the performance of imager 201. First, a scene (frame 0) is captured by imager 201, and applied to histogrammer 204. As will be appreciated by those skilled in the art, a histogrammer sorts the pixels received into "bins" that represent the pixel's gray level, i.e. brightness or intensity. Histogrammer 204 thus provides a histogram containing information representing the global brightness distribution of a given frame. From this distribution, the charge capacity control voltage function can be adjusted to either expand or compress the next image to use the full 4096 levels of gray scale resolution of imager 201.

Figure 3:
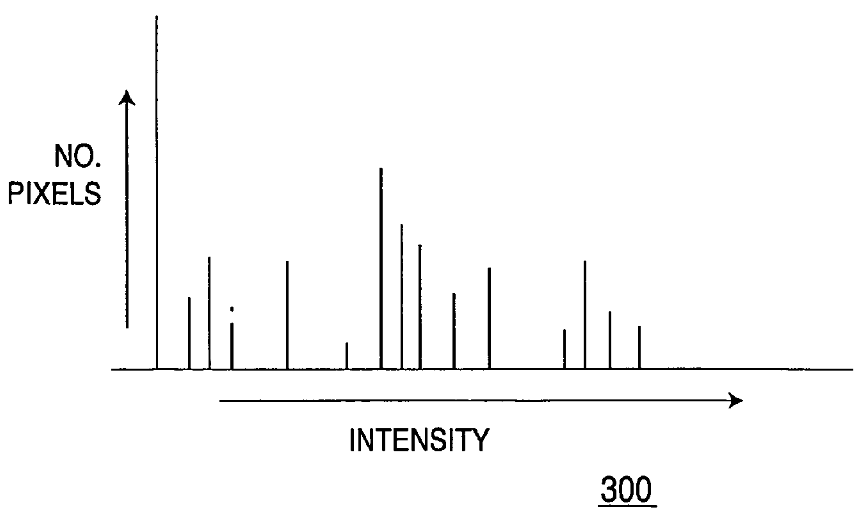
FIG. 3 shows an exemplary histogram to illustrate the method of operation of the video processing system of FIG. 2.

Referring now to FIG. 3, there is shown an exemplary histogram 300 to illustrate the method of operation of signal processing system 200 of FIG. 2. Exemplary histogram 300 shows the global brightness distribution of pixels of frame 0. From this distribution, brightness or intensity information about frame 0 can be determined by feedback function generator 206, which receives the histogram. Feedback function generator 206 generates function information that sets the first time period for imager 201, for capturing the next frame, so that light at the level of the brightest object in frame 0 will not saturate but will just reach the saturation point of the imager. For light of a given level to just reach the saturation point of the imager means that, at the end of the integration period, light of this level would have caused a photodetector to almost reach full charge capacity. Thus, the function information generated by function generator 206 for a two-step non-linear voltage function is a number indicating the time during the integration period at which the first voltage V1 should change to the second voltage V2.

For example, histogram 300 can be used by feedback function generator 206 to determine what is the intensity or brightness of the brightest part of the image that is considered to be an object (cluster of pixels). Such an analysis can be made, rather than simply using the intensity level of the brightest pixel in the frame, so as to avoid making decision based on defective (always white) pixels or only a few bright pixels. Thus, for example, a decision is made by feedback function generator 206 as to what charge capacity control voltage function to use for the next frame, based on the intensity level or gray scale of the 100 brightest pixels. Thus, for example, if the brightest object (not merely a few isolated pixels) of frame 0 has an intensity of approximately I2, then feedback function generator 206 generates function information that sets the first time period to slightly less than t1, as illustrated in FIG. 1B. If, however, the brightest object of frame 0 has an intensity of approximately I3, then feedback function generator 206 generates function information that sets the first time period to approximately t2, as illustrated in FIG. 1C.

Thus, by using the dynamic adjustment of the charge capacity control voltage function of the present invention, the next frame to be captured is effectively "compressed" into the working dynamic range of the imager, but is compressed to the minimum extent necessary so as to maximize contrast ratio and scene information content.

In one embodiment, imager 201 controls the charge capacity control voltage during the integration period in accordance with the function information provided by function generator 206. In an alternative embodiment, function generator 206 provides the charge capacity control voltage directly to imager 201 via line 213 during the integration period in accordance with the function generated. In another alternative embodiment, feedback function generator 206 generates function information to ensure only that light at the level of the brightest object in frame 0 does not saturate the imager, but does not ensure that light at this level would almost or just saturate the imager.

System 200 provides further signal processing, as necessary, for the captured video frames. First, since dynamic adjustment of the charge capacity control voltage effectively creates a non-linear photodetection response during integration time, the inverse function of this function is generated by feedback function generator 206 and applied to contrast corrector 205. This allows the non-linear manner in which charge is accumulated to be appropriately mapped to the corresponding light intensity level that caused the charge indicated by the pixel. This helps to maintain true color and contrast representation, which is necessary for color imaging where the pixel color is represented by multiple imaging sensor elements. As will be appreciated, contrast correction is important when several sensor elements are combined to make a color pixel. If one sensor element containing one color component (e.g. red) contains low luminance, it will be uncompressed while another element (e.g. blue) is very bright and is compressed, with no correction for this lop-sided compression, the color detected will not be a true representation of the scene. By performing the inverse function on each pixel, the red pixel in this case would remain unchanged while the blue pixel would be decompressed to restore the contrast between the luminances in the sensor elements and truly represent the actual color of the scene.

This contrast correction can also be used on gray-scale images when the contrast needs to be maintained and the image will be expanded from the dynamic range of the imager pixels (e.g. 12 bits) to a higher optical scene dynamic range, e.g. 16 bits. Thus, the output of contrast corrector 205 can have, for example, a 16-bit dynamic range, even though each pixel of imager 201 has only 12-bit resolution.

Histogram equalizer/projection block 207, in one embodiment, is used to optimally display the wide dynamic range of the received input image (e.g., 12-bit image from imager 201 via line 216 and MUX 210 or 16-bit contrast-corrected image via contrast corrector 205 and MUX 210) onto a lower dynamic range monitor, such as 8-bit resolution output monitor 220. This serves to effectively display the maximum amount of information on output monitor 220 by maximizing the information content in each link in the video chain.

As will be appreciated, histogram equalization and histogram projection are commonly used methods of contrast enhancement using so-called "point processing" techniques. Using such techniques, an image with a uniform density of gray levels is produced generally maximizing the viewing contrast to present the most information to the viewer. Such techniques also map higher resolution data to a smaller resolution monitor without clipping, for optimal display on a monitor of limited resolution. Thus, the histogram equalization of histogram equalizer/projection block 207 will redistribute the gray scales so that the fine detail in both the bright and dark regions of the scene are properly enhanced. To perform such processing, histogram equalizer/projection block 207 requires only the histogram that is already available from the feedback function generator 206.

Line 216 allows the contrast correction of contrast corrector 205 to be bypassed if desired by setting multiplexer 211 to pass the uncorrected video on line 216 to output monitor 220. Line 217 allows the histogram equalization and projection of histogram equalizer/projection block 207 to be bypassed if desired by setting multiplexer 211 to pass the uncorrected video on line 217 to output monitor 220. Thus, by appropriately switching MUXs 210 and 211, one of four video signals may be displayed on output monitor 220: (1) unprocessed (i.e. skipping contrast corrector 205 and histogram equalizer/projection block 207); (2) contrast enhanced (i.e. skipping histogram equalizer/projection block 207); (3) histogram enhanced (i.e. skipping contrast corrector 205); or (4) histogram and contrast enhanced.

As will be appreciated, the dynamic feedback of the present invention may be used with charge capacity control voltage functions other than the two-voltage non-linear function illustrated in FIGS. 1B and 1C. For example, multiple discrete steps and voltages, or a continuously increasing charge capacity control voltage may be used, as may linearly increasing charge capacity control voltage waveforms. In these cases, global brightness distribution information provided by histogrammer 204 is used to suitably adjust these functions. Thus, for example, if a continuously increasing charge capacity control voltage is used, the brightness of the brightest object in the previous frame is used to adjust the shape of the charge capacity to control voltage function so that light levels of this brightness will just saturate. In this case, feedback function generator 206 generates function information that instructs imager 201 how to vary the charge capacity control voltage function.

It will also be appreciated that histograms from previous frames other than the immediately previous frame may be used. For example, a histogram of a running average of the last five frames may be used.

It will be understood that various changes in the details, materials, and arrangements of the parts which have been described and illustrated above in order to explain the nature of this invention may be made by those skilled in the art without departing from the principle and scope of the invention as recited in the following claims.

The invention claimed is:

1. An imaging system, comprising:

an imager having an array of photodetectors for capturing respective picture elements (pixels) of a time sequence of images, each photodetector being configured to accumulate an amount of charge during an integration period, the amount of charge accumulated being proportional to an illumination intensity applied to the photodetector during the integration period and being limited by a charge capacity voltage applied to the imager, and to provide a pixel intensity value being proportional to the amount of accumulated charge;

an image brightness detector, coupled to the imager to provide a measure of the illumination intensity for a brightest object in the image captured by the imager; and a charge capacity voltage generator, coupled to the image brightness detector and responsive to the measure of intensity for the brightest object in a previous image to adjust the charge capacity voltage applied to the imager to capture a current image.

2. An imaging system according to claim 1, wherein:

the image brightness detector includes a historgrammer which generates a histogram of pixel intensity values in the image, and the charge capacity voltage generator analyzes the histogram provided by the histogrammer to identify a highest intensity value corresponding to at least N of the pixel intensity values as being the measure of intensity for the brightest object in the image, where N is an integer.

3. An imaging system according to claim 2, where N equals 100.

4. An imaging system according to claim 2, further comprising an equalizer, coupled to the histogrammer and responsive to the histogram provided thereby to redistribute the pixel intensity values provided by the imager into a range of output pixel intensity values, whereby fine detail in both bright and dark regions of the sequence of images is enhanced.

5. An imaging system according to claim 1, further comprising a contrast corrector, responsive to the charge capacity voltage provided by the charge capacity voltage generator to adjust the pixel intensity values provided by the imager to conform to a dynamic range that maintains a contrast level consistent with previous images in the image sequence.

6. An imaging system according to claim 1, wherein the charge capacity voltage generator generates a first charge capacity voltage for a first portion of the integration period and a second charge capacity voltage, greater than the first charge capacity voltage during a second portion of the integration period, after the first portion, and the first portion has a duration determined by the measure of the intensity for the brightest object in the previous image.

7. An imaging system, comprising:

an imager having an array of photodetectors for capturing respective picture elements (pixels) of a time sequence of images, each photodetector being configured to accumulate an amount of charge during an integration period, the amount of charge accumulated being proportional to an illumination intensity applied to the photodetector during the integration period and being limited by a charge capacity voltage used by the imager, and to provide a pixel intensity value being proportional to the amount of accumulated charge;

an image brightness detector, coupled to the imager to provide a measure of the illumination intensity for a brightest object in the image captured by the imager; and a function generator, coupled to the image brightness detector and responsive to the measure of intensity for the brightest object in a previous image of the sequence of images to provide a control function that adjusts the charge capacity voltage generated by the imager to capture a current image of the sequence of images.

8. An imaging system according to claim 7, wherein:

the image brightness detector includes a historgrammer which generates a histogram of pixel intensity values in the image, and the function generator analyzes the histogram provided by the histogrammer to identify a highest intensity value corresponding to at least N of the pixel intensity values as being the measure of intensity for the brightest object in the image, where N is an integer.

9. An imaging system according to claim 8, further comprising an equalizer, coupled to the histogrammer and responsive to the histogram provided thereby to redistribute the pixel intensity values provided by the imager into a range of output pixel intensity values, whereby fine detail in both bright and dark regions of the sequence of images is enhanced.

10. An imaging system according to claim 7, further comprising a contrast corrector, responsive to the control function provided by the control function generator to adjust the pixel intensity values provided by the imager to conform to a dynamic range that maintains a contrast level consistent with previous images in the image sequence.

11. An imaging system according to claim 7, wherein the function generator causes the imager to generate a first charge capacity voltage for a first portion of the integration period and a second charge capacity voltage, greater than the first charge capacity voltage, during a second portion of the integration period, after the first portion, and the first portion has a duration determined by the measure of the intensity for the brightest object in the previous image.

12. An imaging system, comprising:

an imager having an array of photodetectors for capturing respective picture elements (pixels) of a time sequence of images, each photodetector being configured to accumulate an amount of charge during an integration period, the amount of charge accumulated being proportional to an illumination intensity applied to the photodetector during the integration period and being limited by a charge capacity voltage generated by the imager, and to provide a pixel intensity value being proportional to the amount of accumulated charge;

a historgrammer, coupled to the imager, which generates a histogram of the pixel intensity values provided by the imager;

a function generator, coupled to the histogrammer, which analyzes the histogram provided by the histogrammer for a previous image in the sequence of images, to identify a highest intensity value corresponding to at least N of the pixel intensity values as being a measure of intensity for a brightest object in the previous image, where N is an integer, the function generator generating a control function that adjusts the charge capacity voltage generated by the imager to capture a current image in the sequence of images responsive to the measure of intensity of the brightest object in the previous image;

a contrast corrector, responsive to the control function provided by the control function generator to adjust the pixel intensity values provided by the imager to conform to a dynamic range that maintains a contrast level consistent with previous images in the image sequence; and an equalizer, coupled to the histogrammer and responsive to the histogram provided thereby to redistribute the pixel intensity values provided by the contrast corrector into a range of output pixel intensity values, whereby fine detail in both bright and dark regions of the sequence of images is enhanced.

13. An imaging system according to claim 12, further comprising:

a first multiplexer, coupled to selectively provide the pixel intensity values from the imager and the adjusted pixel intensity values from the contrast corrector to the equalizer, whereby the first multiplexer selectively bypasses the contrast corrector; and a second multiplexer, coupled to selectively provide the pixel intensity values from the imager, the pixel intensity values provided by the first multiplexer and the redistributed pixel intensity values from the equalizer as output pixel intensity values, whereby the second multiplexer selectively bypasses the equalizer.

14. A method for controlling an imaging system having an array of photodetectors each of which captures a respective picture element (pixel) of a time sequence of images, each photodetector being configured to accumulate an amount of charge during an integration period, the amount of charge accumulated being proportional to an illumination intensity applied to the photodetector during the integration period and being limited by a charge capacity voltage, and to provide a pixel intensity value being proportional to the amount of accumulated charge, the method including the steps of:

measuring an illumination intensity for a brightest object in the image captured by the imager; and adjusting the charge capacity voltage used by the imager to capture a current image of the sequence of images responsive to the measured illumination intensity for the brightest object in a previous image of the sequence of images.

15. A method according to claim 14, wherein the step of measuring the illumination intensity for the brightest object in the image captured by the imager includes the steps of:

generating a histogram of pixel intensity values in the image, and analyzing the histogram to identify a highest intensity value corresponding to at least N of the pixel intensity values as being the measure of intensity for the brightest object in the image, where N is an integer.

16. A method according to claim 15, further comprising the step of redistributing the pixel intensity values provided by the imager into a range of output pixel intensity values, responsive to the histogram whereby fine detail in both bright and dark regions of the sequence of images is enhanced.

17. A method according to claim 13, further comprising the step of adjusting the pixel intensity values provided by the imager, responsive to the adjusted charge capacity voltage, to conform the adjusted pixel intensity values to a dynamic range that maintains a contrast level consistent with previous images in the image sequence.

18. A method according to claim 13, wherein the step of adjusting the charge capacity voltage applied to the imager includes the steps of:

generating a first charge capacity voltage for a first portion of the integration period; and generating a second charge capacity voltage, greater than the first charge capacity voltage during a second portion of the integration period, after the first portion;

wherein the first portion has a duration determined by the measure of the intensity for the brightest object in the previous image.

19. A computer readable medium including computer program instructions that control a computer to implement a method that controls an imaging system having an array of photodetectors each of which captures a respective picture element (pixel) of a time sequence of images, each photodetector being configured to accumulate an amount of charge during an integration period, the amount of charge accumulated being proportional to an illumination intensity applied to the photodetector during the integration period and being limited by a charge capacity voltage, and to provide a pixel intensity value being proportional to the amount of accumulated charge, the method including the steps of:

processing the pixel intensity values provided by the imager to measure an illumination intensity for a brightest object in the image captured by the imager; and adjusting the charge capacity voltage used by the imager to capture a current image of the sequence of images responsive to the measured illumination intensity for the brightest object in a previous image of the sequence of images.

20. A computer readable medium according to claim 19, wherein the computer program instructions that cause the computer to adjust the charge capacity voltage used by the imager cause the computer to provide a first charge capacity voltage for a first portion of the integration period and to generate a second charge capacity voltage, greater than the first charge capacity voltage during a second portion of the integration period, after the first portion, wherein the first portion has a duration determined by the measure of the intensity for the brightest object in the previous image.

* * * * *